United States Patent [19]
Gupta

[11] Patent Number: 5,348,615
[45] Date of Patent: Sep. 20, 1994

[54] SELECTIVE PLANARIZATION METHOD USING REGELATION

[75] Inventor: Subhash Gupta, San Jose, Calif.

[73] Assignee: Advanced Micro Devices, Inc., Sunnyvale, Calif.

[21] Appl. No.: 119,903

[22] Filed: Sep. 10, 1993

Related U.S. Application Data

[63] Continuation of Ser. No. 964,587, Oct. 21, 1992, abandoned.

[51] Int. Cl.$^5$ ............................................. H01L 21/306
[52] U.S. Cl. .................................... 156/635; 156/636; 156/645; 437/228; 437/225
[58] Field of Search ...................... 156/635, 636, 645; 437/225, 228

[56] References Cited

U.S. PATENT DOCUMENTS 5,009,240  4/1991  Levi ............................................ 134/7
5,264,074  11/1993  Muroyama et al. ................. 437/228

FOREIGN PATENT DOCUMENTS 63-300867  12/1988  Japan .
1-09624   1/1989  Japan .
3-25937   2/1991  Japan .

Primary Examiner—Tom Thomas
Assistant Examiner—Trung Dang
Attorney, Agent, or Firm—Gerald Fisher

[57] ABSTRACT

Technique and apparatus for planarizing microsteps on a substrate by compressing the surface to be smoothed against a frozen layer of an etchant, where the compressive force is sufficient to melt the etchant at the contact edges between said microsteps and said etchant.

11 Claims, 5 Drawing Sheets

SELECTIVE PLANARIZATION METHOD USING REGELATION

This is a continuation of copending application, now abandoned, Ser. No. 07/964,587, filed Oct. 21, 1992, entitled "Selective Planarization Method and Apparatus" now abandoned.

FIELD OF INVENTION

This invention relates to a new method for smoothing a surface.

BACKGROUND OF THE INVENTION

There are broad industrial requirements for smoothing processes. In general industrial smoothing processes are in the following classes:

a) mechanical polishing—friction abrasion polishing and lapping using harder materials or abrasives such as in polishing of optical lens and metallic reflectors.

b) chemical bath etching—general industrial process to smooth parts after machining employing chemically active solvents.

c) plasma sputtering and etching—partially ionized gases sputter away high points or creation of volatile reaction products by ion bombardment can be used for extensive use in semiconductor manufacture for many purposes including smoothing.

In connection with the manufacture of semiconductor microelectronic devices, specialized smoothing processes have become important in support of several aspects of the manufacture of those devices. In particular, as semiconductors have become more densely populated, they have required multiple overlying layers of metal interconnections which need to be electrically isolated by multiple layers of dielectric materials. Because the processes employ photolithographic techniques to pattern the metal interconnects, it is essential that the surface be as flat as possible so that the depth of field of the optical imaging system results in very precise patterns, i.e., sharp line images across the entire wafer. This requires flatness on the order of 25Å across the wafer. To meet these requirements, new smoothing processes for semiconductor processing has advanced the art of smoothing.

The microelectronic smoothing processes to advance photolithography are now called "planarization" because of the flatness requirement over the dimension of the diameter of the wafer. The most common current semiconductor planarization process employs a specialized plasma etching process. In this process, the low spots in the wafer surface are first filled with a thin spun on layer of a flowable and hardenable material, which material has an etch rate which is close to the etch rate of the interlayer dielectric material. Next, the thin layer is hardened and the wafer is plasma etched. Usually the etch is continued until the higher regions and the spin-on-layer is substantially entirely removed. Frequently, this process is repeated several times. This procedure is known as the "Double Etch-Back Process."

The Double Etch-Back Process provides good smoothing for processes having line widths greater than 1 micron but has not been entirely satisfactory because of the shrinkage of the volume of the flow-on-material when it is hardened. Accordingly, in those regions of the wafers in which the higher regions are more widely separated, a deep sag can occur which is difficult to planarize even with repeat of the process.

To overcome these problems, a chemical-mechanical so called "global" process having larger scale planarization is becoming common. The chemical-mechanical process is a derivative of the older lens polishing procedures except that a liquid chemical etchant for the dielectric is substituted for the abrasives of the earlier processes. In this process, the wafer surface is pressed against a rotating slightly rough surface with the non-compressible liquid etchant between them. This process combines a mild mechanical friction action along with the accelerated chemical action on the roughened high spots to achieve broad "global" planarization. This chemical-mechanical process is expensive and time consuming to implement because each wafer must be individually handled and processed. Additionally, the process is not as selective as desired because the chemical etchant reacts with almost equal rate on the lower regions as on the high.

SUMMARY OF THE INVENTION

It is an object of this invention to provide a smoothing process and apparatus which is more highly selective to reduce only high spots on the substrate being smoothed.

It is a still further object to provide a faster and less expensive process for ultra smoothing of generally flat substrates.

It is a feature of this invention that it employs frozen etchant materials which are micro-regionally activated by pressure and/or heat initiated by the increased pressure and/or heat transmitted to said frozen etchant material by contact with the high spots on the substrate being smoothed.

DETAILED DESCRIPTION OF THE INVENTION

This invention employs a process of regelation which relates to the regional melting of a frozen material by applying pressure on the material. Everyone is familiar with the sight of an ice skater gliding smoothly over the ice. Physics tells us that this is made possible by the fact that all the weight of the skater is being transmitted to the ice through one of the edges of the blade of a skate. The width (w) of the portion of the blade edge which is in contact with the ice when multiplied by the length (L) of the blade defines the area in contact with the ice. Because the area is small, the pressure is high. In the region of ice immediately beneath the edge contact, because of the high pressure, the ice melts into water and the water provides a very low friction, non compressible fluid layer which permits the skater to essentially float across the ice. This process can be demonstrated for all frozen liquid materials. When a frozen material is compressed against a sharp edge, there exists a pressure at which the frozen material under the edge will melt.

Chemical processes are generally temperature dependent. For example, it is known that frozen etchants will not react at significant rates with materials that would be etched rapidly by the same etchant materials in liquid form. I have combined these two concepts to provide a technique to selectively etch high points on a substrate to be smoothed.

By applying the face of a substrate to be smoothed into contact with a frozen layer of an etchant for that substrate, and by applying a force to the substrate which is sufficient to raise the pressure between protruding micropoints on the surface which are in contact and the frozen etchant, a method is provided to melt the etchant in the microregion of the protruding micropoints. The force could be a weight applied directly on the substrate. This process is self-limiting if the force to the substrate is selected so that the liquid etchant dissolves away the protruding micropoints until the total contact area beneath the substrate increases so that the pressure at any protuberance decreases to a value below the melting point. Theoretically, to the extent that force on the substrate can be increased without fracture of the frozen material on the substrate, this approach can be applied indefinitely for infinite smoothing and is self limiting. Dilution of the etchant could become a problem with this approach because it is known that mixtures have different freezing points, usually lower in temperature, than the pure material. This problem can cause the process to loose its selectivity for the high spots and/or reduce the etch rate. Accordingly, sliding movement between the substrate and the frozen etchant to bring fresh unmixed etchant materials into contact with the micropoints assists in the process.

Figure 1:
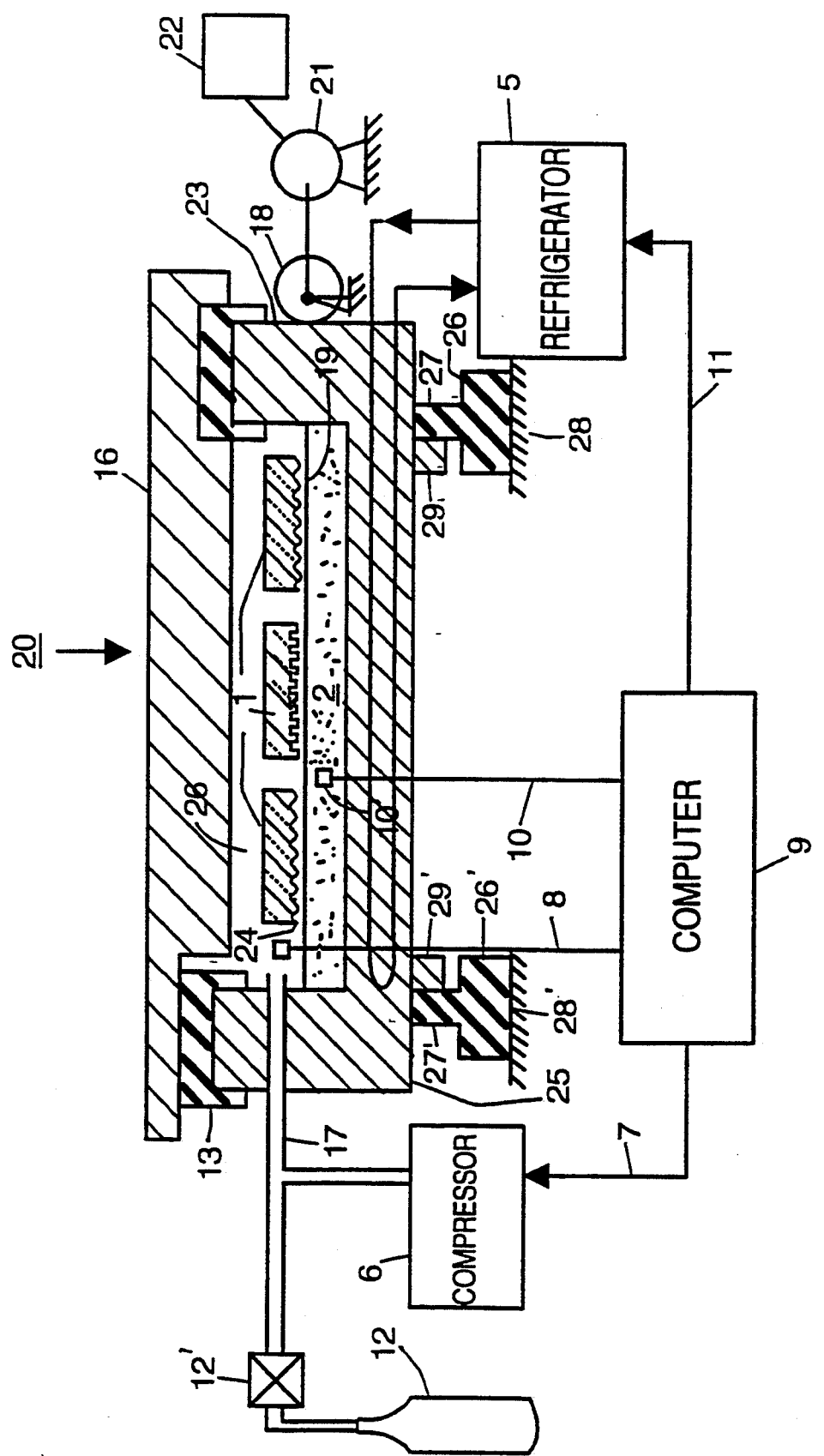
FIG. 1 is a schematic of the cross section of apparatus for carrying out the process of the invention.

With reference to FIG. 1, a specially configured pressure vessel 20 with refrigeration is described to carry out the inventive process. The base of the vessel 20 contains a cavity 26 to receive and hold an etchant material 2 in the fluid state. The base of the cavity is interlaced with cooling coils 4 from a refrigerator 5. The refrigerator is under control from computer 9 on control line 11. The computer receives an input on connector 10 from temperature sensor 10'. The vessel has a lid 16 which is heavy enough to seal against resilient seal 13. Alternatively, the lid can have a clamp (not shown). Compressor 6 provides a compressed gas pressure output 17 to controllably pressurize the vessel 20 under control from computer 9 in response to pressure sensor 8. In certain instances, the inlet pressurized gas source can be a dry gas from a bottle 12 through a valve 12' such as nitrogen or alternatively a filtered dried air.

In contact with the side wall 23 of chamber 20 is a cam assembly 18 driven by motor 21 under control of variable frequency power supply 22. In operation, the fluid etchant 2 is placed into the vessel and is frozen, preferably at one atmosphere total pressure while the liquid surface is undisturbed. To obtain a totally flat surface, the gas above the fluid etchant in the vessel is caused to not move during freezing. This may require special vibration isolation from environmental movements of the building. After the etchant is frozen, the surface 19 will be very flat and the surface 24 of the objects to be smoothed are placed into contact with the flat frozen surface of the etchant, and vessel lid 16 is set in place, clamped and sealed. Next, the pressure is raised in the vessel by activating compressor 6 or opening a valve to the pressure bottle 12. The pressure to be employed depends on the etchant being used and the sum of the areas of the microregion points which are to be smoothed.

Figure 2:
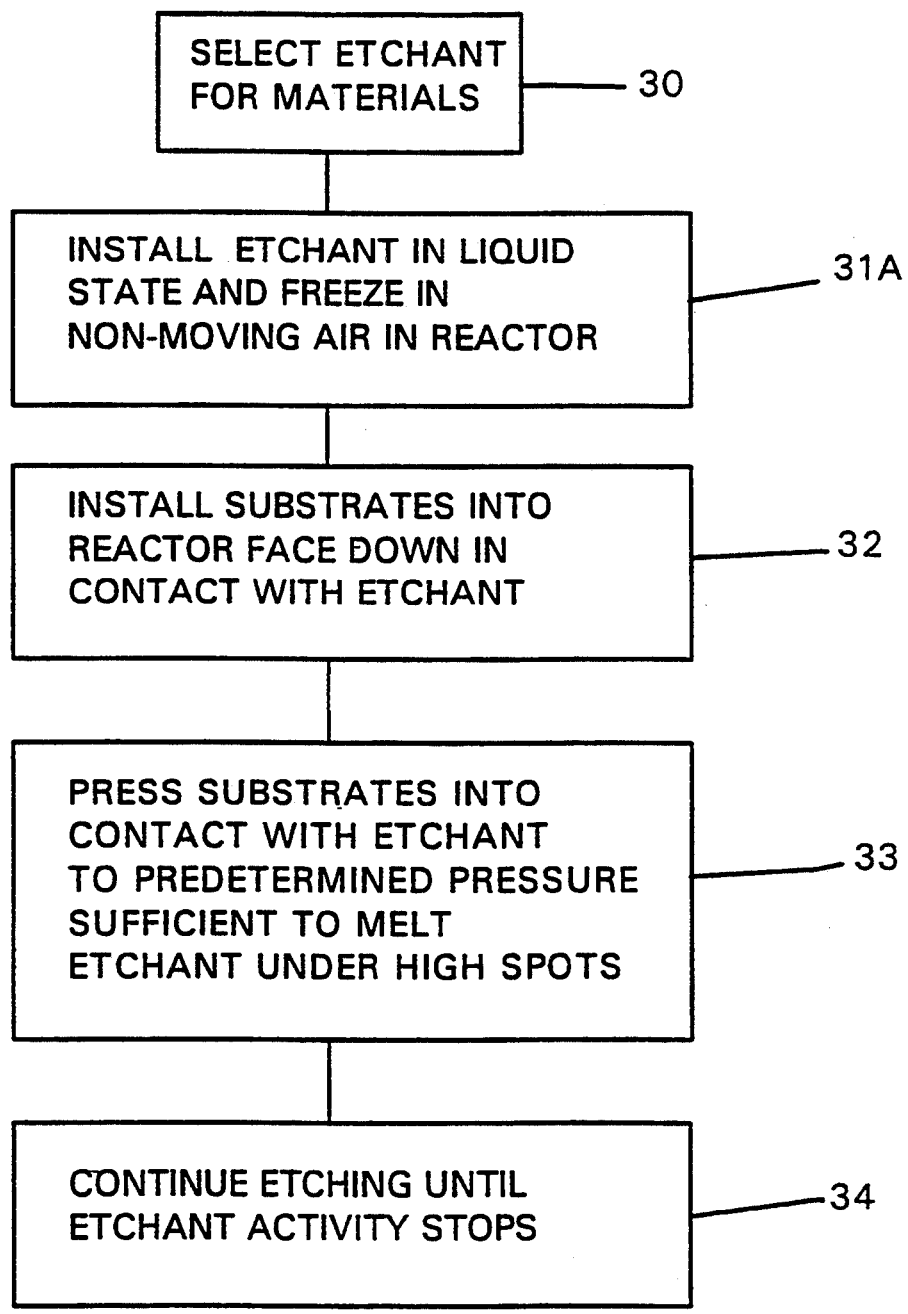
FIG. 2 is a flow diagram of the invention process.

With reference to FIG. 2 the process flow is described. Specific liquid etchants which will dissolve the materials of the substrate to be smoothed are selected 30. Calibration curves are consulted containing the pressure to induce melting for the selected etchant for the largest selected microregion. The selected etchant is installed and frozen 31A. Next, substrates to be planarized are placed 32 into contact with the etchant. The pressure of the vessel is then raised 33 to the predetermined level for melting in contact with the microregions. The process is self limiting and is continued until etching ceases 34.

There are instances where small random movements between the surface being smoothed 24 and the frozen etchant surface 19 is advantageous. With reference to FIG. 1, the cam vibrator 18 in conjunction with the elastomeric support 26, 26', 27 and 27' provides a spring type support for the base 25 which permits small random variable speed vibration movements. Blocks 29 and 29' retain the base between the elastomeric support 27. The elastomeric support 26 and 26' are connected to the ground to support the base 25 in a spring floating manner.

Figure 5A:
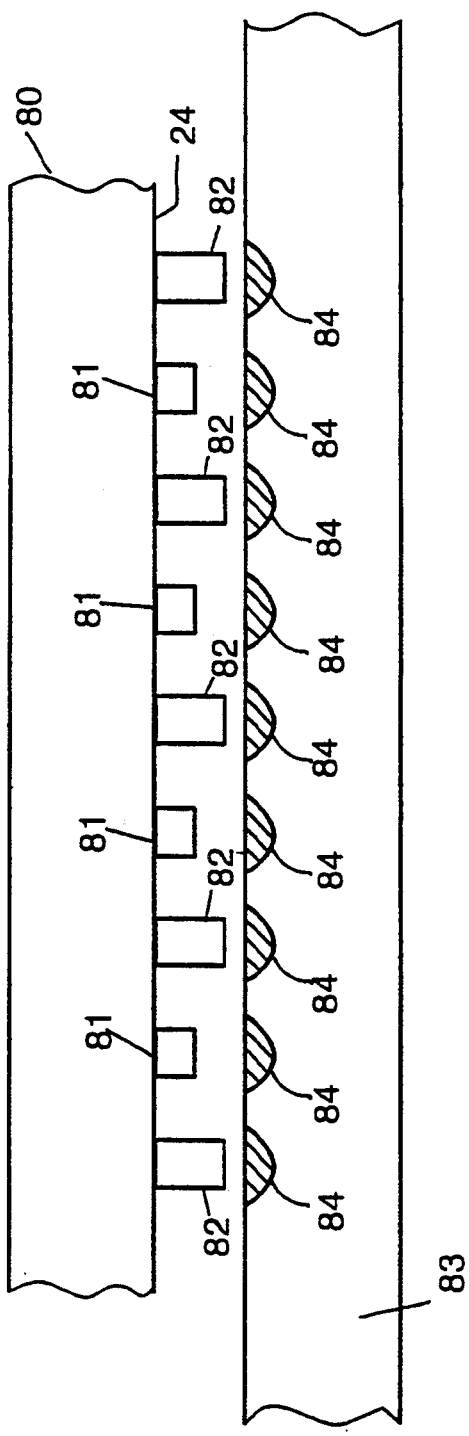
FIG. 5A is illustrative of the inventive process with various height protuberances to be smoothed.
Figure 5B:
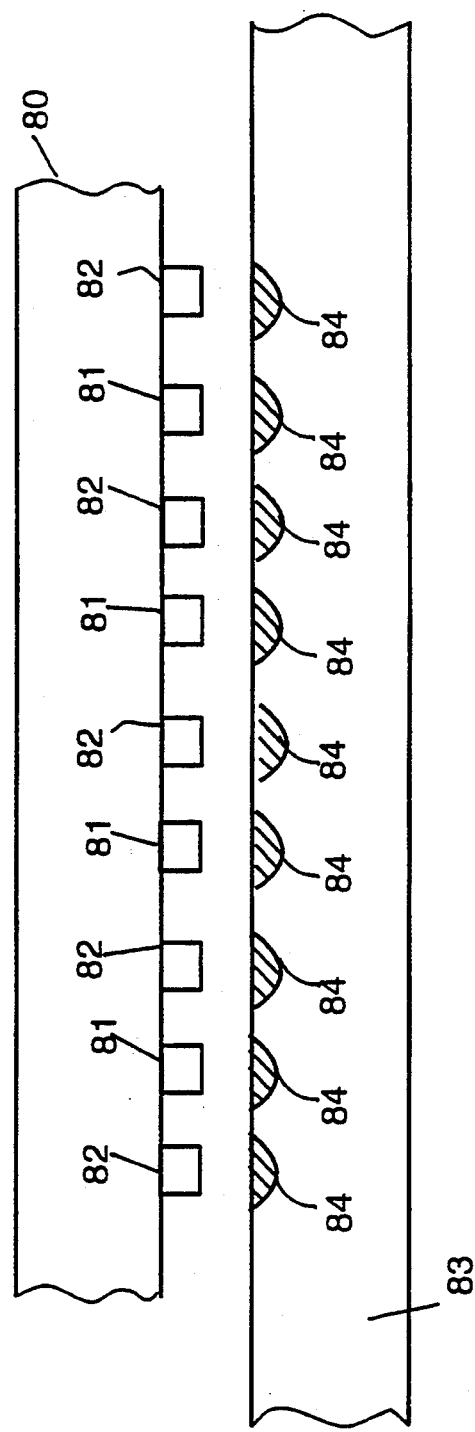
FIG. 5B is illustrative of the inventive process after all protuberances are smoothed to the same level.

With reference to FIG. 5A, microsteps 81 and 82 are shown protruding from surface 80' of the substrate 80. To planarize the surface 24, the substrate is forced against the frozen etchant 83. At first, only the longer microsteps 82 contact the etchant 83 and due to the fact that there are fewer such longer microsteps 82, the pressure is higher and the melting takes place immediately beneath only the longer steps 82. After the longer steps 82 are etched down, as seen in FIG. 5B, all the microsteps 81 and 82' now share the force so that the pressure on each microstep is less if the pressure had been selected to melt the etchant under longer microsteps only, the etchant will refreeze when the pressure on all the microsteps is less than the melting pressure. However, the pressure could have been initially adjusted to be high enough to melt the etchant 84 beneath each of the smaller microsteps 81 and 82' or the pressure could be increased as the process continues.

Assuming that the pressure, P, in the vessel, results in a total force F = PA where A = area of the substrate, if the topology microstep covers 50% of the surface, for the case of FIG. 5A, where 25% are longer microsteps and 25% shorter, the pressure at the high spots would be $$\frac{F}{A/4} = 4 \times \frac{F}{A} = 4P.$$

When the etching reduces the length of the longer microstep to the length of the shorter microsteps, the pressure at the microsteps would be $$\frac{F}{A/2} = 2P.$$

If the etching continues until the substrate is essentially flat, the pressure would reduce to P. Accordingly, the ideal condition would be where pressure in the chamber is selected so that no melting occurs for pressure P, but does occur for pressures greater than P. All materials exhibit a gas-liquid-solid phase diagram. By setting the temperature and pressure for operating point near to but slightly in the solid region of the liquid-solid phase locus, assures that slight local pressure increases such as occur in microregions due to microsteps as described will cause melting and the resulting desired reaction.

For purposes of this invention, the terms "etch" means to dissolve the surface of a material in a solvent and more particularly to selectively dissolve the high spots in the surface of the substrate material.

Figure 3:
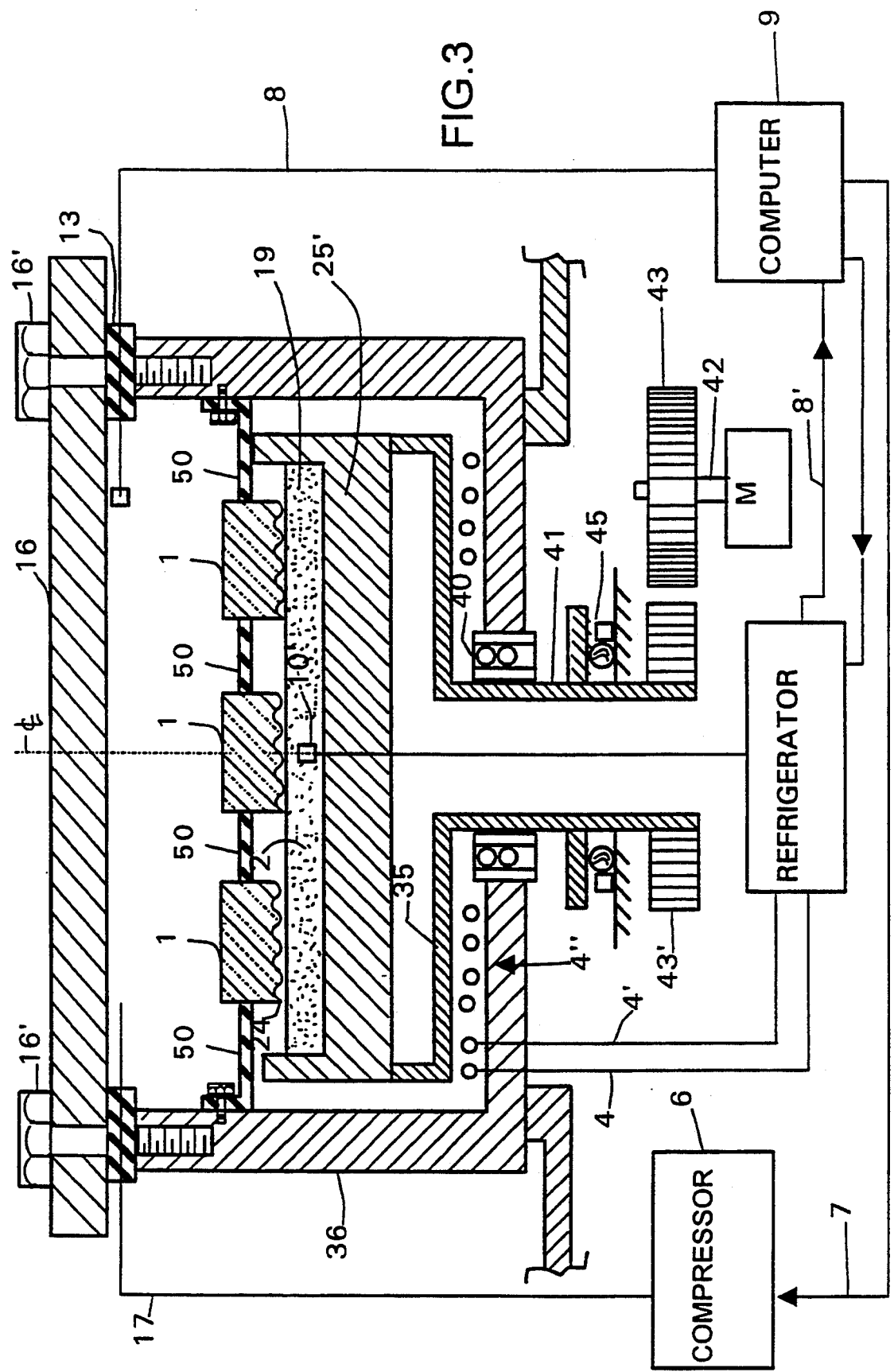
FIG. 3 is a cross section of alternate apparatus for carrying out the process.
Figure 4A:
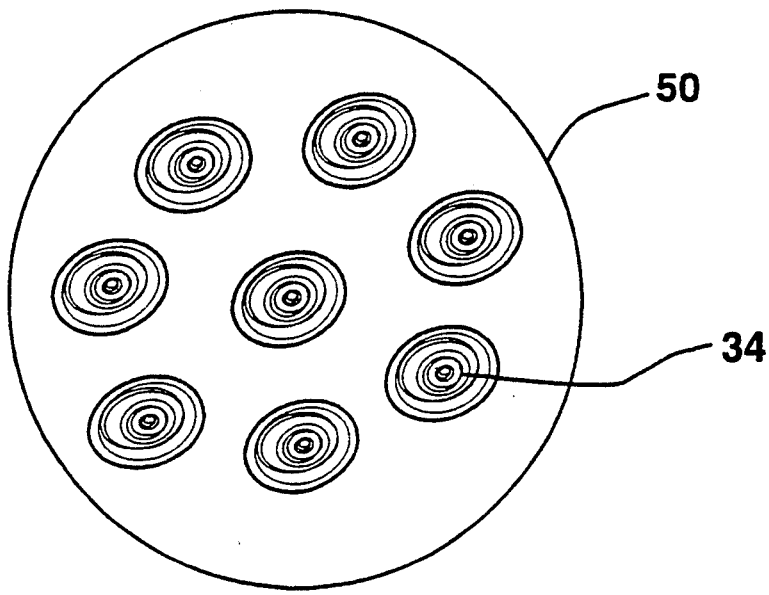
FIG. 4A is indicative of the pattern of melting of the etchant for rotation of mounted wafers in the apparatus of FIG. 1.
Figure 4B:
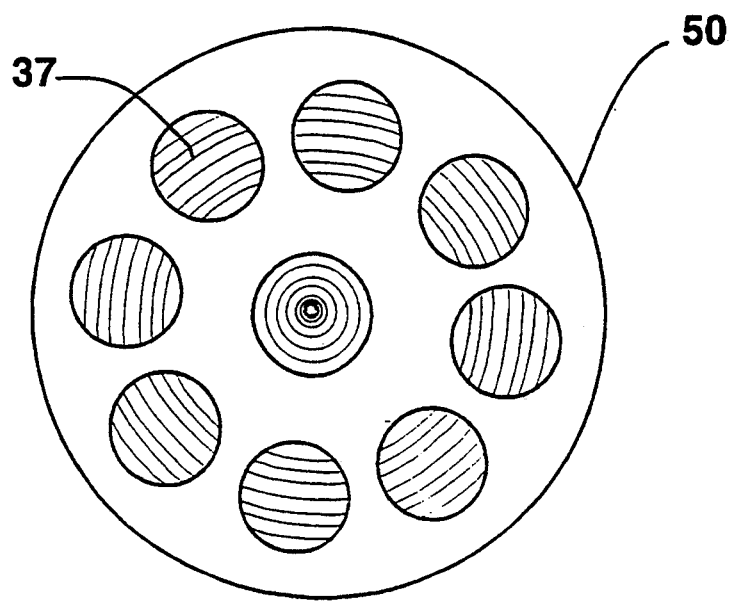
FIG. 4B is indicative of the pattern of melting of the etchant for rotation of a plurality of wafers in the apparatus of FIG. 3.

With reference to FIG. 4A, the random vibration causes a trace of the micropoints in the frozen etchant of FIG. 1. These traces 34 are illustrated for substrates which are generally constrained from translation but which are free to rotate on top of the ice while they remain generally in the same location. The general pattern is a series of concentric circles where the center moves about randomly due to the translational constraint. Translational constraint is not actually required and more substrates could be placed in the cavity if no translational constraint is provided. Once all the surface area of the etchant has been diluted by etching contact with the substrates, the etchant could be melted, mixed and refrozen or it could be replaced entirely if the etch rate becomes too slow due to the dilution. The pattern shown in FIG. 4B are the micropoint traces for the embodiment of FIG. 3. In this case, all traces are concentric about the central axis CL of the rotational cup.

With reference to FIG. 3, a cup 25' is mounted to be rotated by motor 8 through gears 43, 43', which rotates support 35 about the central axis CL through bearing 40 and thrust bearing 45. The refrigeration is much more difficult in this configuration since the entire volume within the chamber under the lid 16 needs to be cooled to the freezing temperature of the etchant via refrigerant conduits 4 and 4' and tubes 4" interlaced on the bottom of the chamber and shown in cross section. A substrate constraint 50 is shown in this drawing which is mounted to the walls 36 of the chamber and is stationary while the central cup 25' is rotated. The constraint 50 contains holes therein for receiving the substrates 1 and restrains their translation and rotation but permits the substrates to slide up and down to be in contact with the surface 24 of the frozen etchant. When the cup is rotated, the traces 37 of FIG. 4B are formed by the microprotrusions. The restraint is not absolutely necessary since it is only desired to restrain the substrates from going around at the same speed as the frozen etchant. Collisions between substrates needs to be avoided in those instances involving fragile substrates such as semiconductor wafers so that the constraint is preferred when planarizing semiconductor wafers.

The invention has been described in conjunction with the preferred embodiments. However, it is not intended that the invention be restricted to these embodiment and the scope of the invention shall be determined by the claims. With this in view,

What is claimed is:

1. A method for smoothing a selected surface area of a substrate comprising the steps of,
    selecting a material which is a liquid at room temperatures and which will etch said substrate;
    creating a frozen layer of said selected material, said frozen layer having a surface which is smooth over an area larger than said area of said selected surface of said substrate;
    causing a portion of the surface of said substrate to come into contact with said frozen layer;
    applying a compressive force to squeeze said portion of said selected surface of said substrate against the surface of said frozen layer;
    causing said compressive force to be at least the amount of force for the temperature and pressure of said frozen layer which causes melting of said frozen layer in those regions where protruding points or edges on said substrate come into contact with said frozen layer.

2. The method of claim 1 wherein relative motion is caused to take place between said substrate and said layer of said frozen etchant material while maintaining said compressive contact between said frozen layer and said substrate.

3. The method of claim 2 wherein the step of applying compressive force is accomplished by enclosing said substrate and said layer of said layer in a sealable chamber and increasing the pressure in said sealable chamber.

4. The method of claim 3 wherein said relative movement is carried out by a slow relative movement of said substrate with respect to said layer of said frozen etchant material along a rotational path.

5. A method for smoothing a selected surface of a substrate having protruding micropoints or edges comprising the steps of,
    selecting a material which is a liquid at a first temperature and which will etch said substrate when said material is in said liquid state;
    creating a frozen layer of said selected material, said frozen layer having a surface area which is smooth over an area which is larger than said selected surface of said substrate;
    applying a portion of the surface of said substrate into contact with said frozen layer;
    applying a compressive force between said portion of the surface of said substrate and the surface of said frozen layer such that the surface of said frozen layer and said portion of the surface of said substrate are compressed together;
    causing said compressive force to be at least theamount of force for the temperature and pressure of said frozen layer which causes melting of said frozen layer in those regions where said portion of the surface of said substrate come into contact with said frozen layer.

6. The method of claim 5 wherein said portion of said substrate which is in contact with said frozen layer when melting occurs has a total contact area $A_1$ and wherein said compressive force is $F_1$ and wherein refreezing of said melted portions of said frozen layer occurs under said micropoints if the pressure under said micropoints on said frozen layer surface is less than $P_1$, where $P_1$ is equal to $F_1/A_1$.

7. The method of claim 6 wherein said step of applying a compressive force includes establishing an operating point which is slightly in the solid region of the liquid-solid phase locus.

8. The method of claim 5 further includes the step of,
    inducing relative motion between said portion of the surface of said substrate and said surface of said frozen layer at the same time that said step of applying a compressive force is being carried out.

9. The method of claim 8 wherein said induced relative motion is random.

10. The method of claim 8 wherein said induced relative motion is circular.

11. The method of claim 5 wherein said step of applying a compressive force comprises,
    applying an adjustable pressure in a chamber containing said substrate and said frozen layer by providing a pressurized gas to compress said substrate into said frozen layer.

* * * * *